(12) United States Patent
Yu et al.

(10) Patent No.: US 6,836,008 B2
(45) Date of Patent: Dec. 28, 2004

(54) SEMICONDUCTOR PACKAGES WITH LEADFRAME GRID ARRAYS AND COMPONENTS

(75) Inventors: Chan Min Yu, Singapore (SG); Ser Bok Leng, Singapore (SG); Low Siu Waf, Singapore (SG); Chia Yong Poo, Singapore (SG); Eng Meow Koon, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/136,186

(22) Filed: May 1, 2002

(65) Prior Publication Data

US 2003/0193091 A1 Oct. 16, 2003

(30) Foreign Application Priority Data

Apr. 16, 2002 (SG) ........................................ 200202206

(51) Int. Cl.[7] .............................................. H01L 23/48
(52) U.S. Cl. ........................ 257/692; 257/666; 257/673; 257/684
(58) Field of Search ............................. 257/692, 666, 257/673, 684, 784, 780, 785

(56) References Cited

U.S. PATENT DOCUMENTS

| | | | |
|---|---|---|---|
| 4,210,926 A | * | 7/1980 | Hacke .......................... 257/673 |
| 5,216,278 A | | 6/1993 | Lin et al. |
| 5,397,921 A | | 3/1995 | Karnezos |
| 5,409,865 A | | 4/1995 | Karnezos |
| 5,420,460 A | | 5/1995 | Massingill |
| 5,581,226 A | | 12/1996 | Shah |
| 5,663,593 A | | 9/1997 | Mostafazadeh et al. |
| 5,677,566 A | | 10/1997 | King et al. |
| 5,710,695 A | | 1/1998 | Manteghi |
| 5,715,593 A | | 2/1998 | Kimura |
| 5,847,455 A | | 12/1998 | Manteghi |
| 5,854,512 A | | 12/1998 | Manteghi |
| 5,866,939 A | | 2/1999 | Shin et al. |
| 5,898,220 A | | 4/1999 | Ball |
| 5,969,416 A | | 10/1999 | Kim |
| 5,973,393 A | | 10/1999 | Chia et al. |
| 5,976,912 A | | 11/1999 | Fukutomi et al. |
| 6,028,356 A | | 2/2000 | Kimura |
| 6,064,111 A | | 5/2000 | Sota et al. |
| 6,083,776 A | | 7/2000 | Manteghi |
| 6,097,087 A | | 8/2000 | Farnworth et al. |

(List continued on next page.)

FOREIGN PATENT DOCUMENTS

JP 406252194 A 9/1994

OTHER PUBLICATIONS

Amagai, Masazumi, "Chip–Scale Packages for Center–Pad Memory Devices," Chip Scale Review, May 1998, pp. 68–77.

Primary Examiner—Luan Thai
(74) Attorney, Agent, or Firm—TraskBritt

(57) ABSTRACT

A semiconductor assembly includes a leadframe with leads having offset portions exposed at an outer surface of a material package to form a grid array. An electrically conductive compound, such as solder, may be disposed or formed on the exposed lead portions to form a grid array such as a ball grid array ("BGA") or other similar array-type structure of dielectric conductive elements. The leads may have inner bond ends including a contact pad thermocompressively bonded to a bond pad of the semiconductor chip to enable electrical communication therewith and a lead section with increased flexibility to improve the thermocompressive bond. The inner bond ends may also be wirebonded to the bond pads. Components for and methods of forming semiconductor assemblies are included.

52 Claims, 4 Drawing Sheets

U.S. PATENT DOCUMENTS

| | | |
|---|---|---|
| 6,114,760 A | 9/2000 | Kim et al. |
| 6,153,924 A | 11/2000 | Kinsman |
| 6,181,000 B1 | 1/2001 | Ooigawa et al. |
| 6,187,612 B1 | 2/2001 | Orcutt |
| 6,228,683 B1 | 5/2001 | Manteghi |
| 6,297,543 B1 * | 10/2001 | Hong et al. .................. 257/666 |
| 6,310,390 B1 | 10/2001 | Moden |
| 6,337,510 B1 * | 1/2002 | Chun-Jen et al. ............ 257/666 |
| 6,359,221 B1 * | 3/2002 | Yamada et al. ............. 174/52.4 |
| 6,387,732 B1 * | 5/2002 | Akram ........................ 438/123 |
| 6,521,483 B1 * | 2/2003 | Hashimoto ................... 438/110 |
| 6,552,427 B2 | 4/2003 | Moden |
| 2002/0031902 A1 * | 3/2002 | Pendse et al. ............... 438/612 |

* cited by examiner

SEMICONDUCTOR PACKAGES WITH LEADFRAME GRID ARRAYS AND COMPONENTS

BACKGROUND OF THE INVENTION

The present invention relates to grid array semiconductor packages and methods of assembling and evaluating the same. In particular, the present invention relates to leadframes for mounting a semiconductor chip for encapsulating to form a complete semiconductor package. The leadframe includes a plurality of leads having a similar length, with offset array pads forming a grid array on the surface of the package.

Semiconductor chips or dice are typically enclosed in semiconductor assemblies, or packages, prior to use. These packages protect chips from the conditions of the surrounding environment and provide leads or other connection points, allowing a chip to be electrically accessed. Packages have typically included a semiconductor chip bonded to a leadframe, either seated on a die paddle or directly to the leads in a leads-over-chip ("LOC") attachment. The contact pads on the semiconductor die are then electrically connected to the chip by wires in wirebond fashion. The connected leadframe and chip are then placed in a mold cavity and encapsulated in a mold compound to form a complete package. The leads extend out from the mold compound, allowing the chip to be electrically accessed. Typically, the leads extend laterally from the package in a flat array, which may be trimmed and formed into a desired conformation.

As electronic devices have decreased in size, alternative methods of assembling and packaging semiconductor dice have been used. These methods decrease the "real estate" or area that is required to install the die on higher-level packaging, such as a printed circuit board. Flip-chip installation of a chip using a ball grid array ("BGA") reduces the real estate used to an area the same as or only slightly larger than the chip dimensions, but introduces a number of difficulties and shortcomings into the manufacturing process. Attempts have been made in the art to provide a semiconductor assembly that includes the benefits of a flip-chip type of attachment while keeping the benefits of a conventional molded package.

Many attempts to combine a grid array onto a molded package have included a leadframe as a component of the complete assembly. The leadframe supplies a number of advantages to the finished assembly. Leads not only furnish electrical connections, but also provide a pathway to conduct heat from a package while in operation. Examples of some such packages are disclosed in U.S. Pat. No. 5,847,455 issued Dec. 8, 1998 to Manteghi and U.S. Pat. No. 5,663,593 issued Sep. 2, 1997 to Mostafazadeh et al., the disclosure of each of which is incorporated by reference in its entirety herein. These patents are directed to assemblies including both leadframes and ball grid arrays that allow the assembly to be mounted in a flip-chip fashion. These assemblies are formed by attaching a semiconductor die to a leadframe die paddle, wirebonding the die to the leads and placing an encapsulant, such as a mold compound, over the semiconductor die and the die face of the leadframe. A soldermask is then applied to the opposite face of the leadframe, and holes are formed in the soldermask. Solder balls are disposed within the holes to form a ball grid array.

With these soldermask covered leadframe packages, the complete structure of the flat leadframe is protected only by soldermask on one side. The soldermask adds an additional laminate layer to the assembly, providing additional points for potential contaminant and moisture entry. Applying the soldermask and forming the holes therein add additional steps to package fabrication, increasing manufacturing costs and the opportunity for error.

U.S. Pat. Nos. 5,715,593 and 6,028,356 issued Feb. 10, 1998 and Feb. 22, 2000, respectively to Kimura, represent an attempt to resolve these shortcomings. A flat leadframe is attached to a semiconductor die using wire bonds. The package is then encapsulated in two steps, one encapsulating the chip and the chip side of the leadframes and one encapsulating the leadframe. In the latter step, the mold includes bumps which contact the leadframe, producing dimples that allow the leads to be accessed. Solder balls may then be created in the dimples.

By placing the solder balls into package dimples, Kimura-type devices introduce additional problems into package formation. As the molds are reused, wear can erode the surface of the contact bumps requiring replacement and preventing contact with the leadframe. Mold compound that intrudes between the leadframe and a contact bump can form a resin film that requires removal or can interfere with the electrical connection. Removal of this thin film is difficult as it is recessed within the dimples.

U.S. Pat. No. 5,866,939 issued Feb. 2, 1999 to Shin et al., the disclosure of which is incorporated herein by reference in its entirety, is directed to another semiconductor package including a BGA. The Shin-type device is a semiconductor package featuring a semiconductor die attached to a leadframe. The leads of the leadframe are bent, causing the lead ends to terminate at a surface of the package. The lead ends are used to form a grid array. The position of the lead end is determined by the length of the lead and the direction of the lead path. Shin-type devices thus have multiple leads of differing lengths. This approach may result in a relatively weaker structure, as reinforcement from the leadframe may be reduced compared to packages where the leads are of similar length and run throughout the package. Further, the varied lead lengths may compromise signal transmission, especially in higher-speed, higher-frequency devices. Additionally, in the Shin-type packages, the semiconductor die is connected to the leadframe through wirebonding, solder joints or bumping, thus adding fabrication steps and materials.

BRIEF SUMMARY OF THE INVENTION

The present invention includes apparatus and methods for fabricating semiconductor packages, or assemblies. One type of semiconductor assembly includes a leadframe with leads featuring an offset portion exposed at a surface of the package to form a grid array. A volume of electrically conductive material, such as solder or a conductive or conductor-filled epoxy, may be disposed or formed on each exposed portion to form an array of solder balls, or other connection structures, in a ball grid array ("BGA") or similar array structure. Semiconductor assemblies may include a leadframe where a lead has an inner bond end wire bonded or thermocompressively bonded to a bond pad of the semiconductor chip to enable electrical communication therewith. Leads to be thermocompressively bonded may include a section proximate the inner bond and with increased flexibility to improve the thermocompressive bond. Leadframes and methods of forming semiconductor assemblies are included within the present invention.

BRIEF DESCRIPTION OF THE DRAWINGS

In the drawings, which depict the best mode presently known for carrying out the invention.

DETAILED DESCRIPTION OF THE ILLUSTRATED EMBODIMENTS

Figure 1:
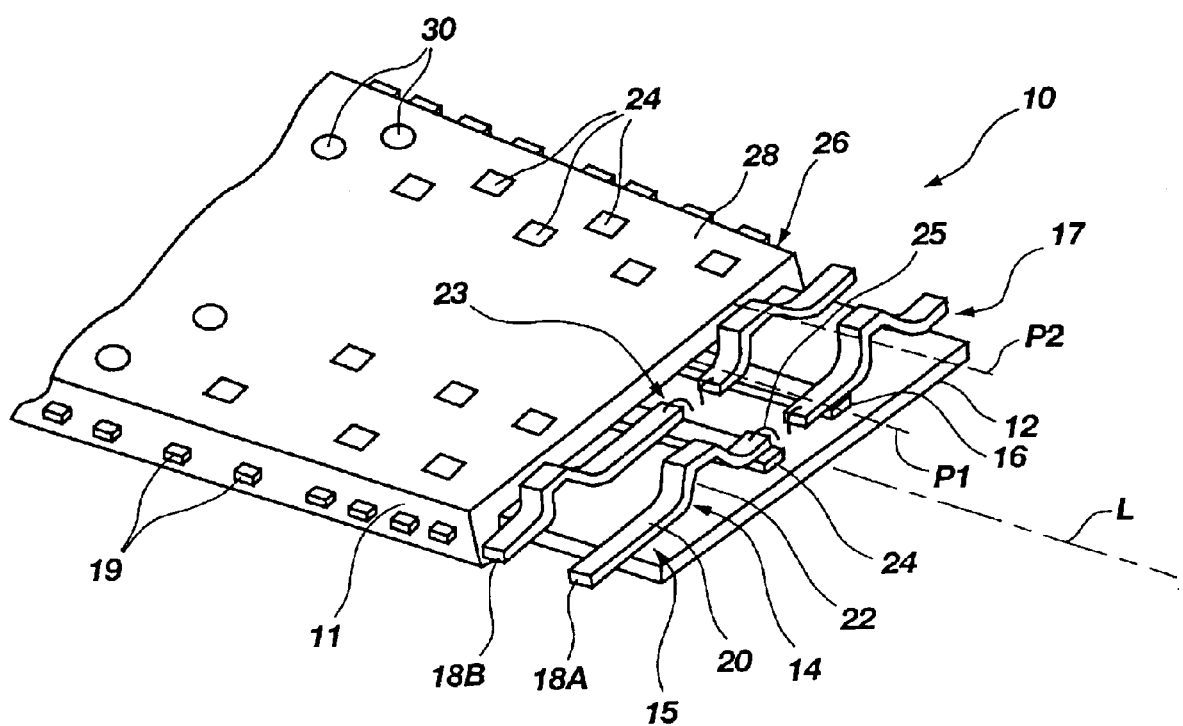
FIG. 1 is a cutaway perspective view of one embodiment of a semiconductor assembly made in accordance with the principles of the present invention.
Figure 2:
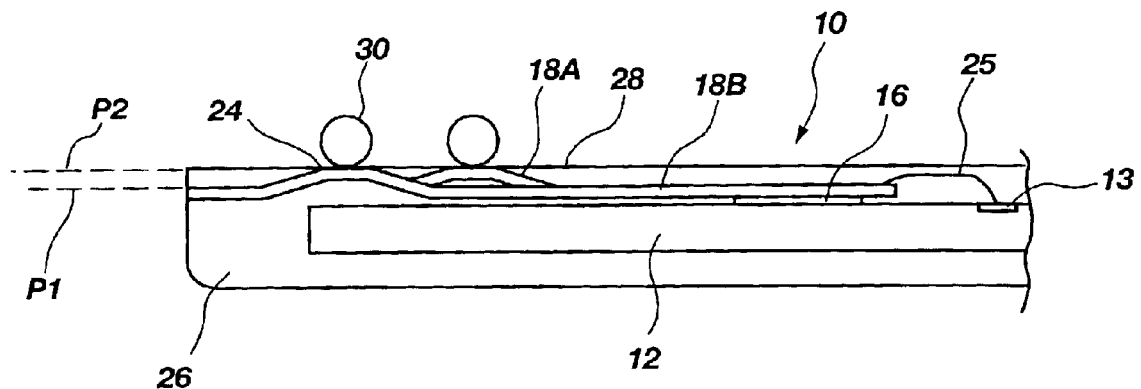
FIG. 2 is a cutaway side view of a section of the embodiment of FIG. 1.

Reference will now be made to FIGS. 1 and 2. FIG. 1 depicts a perspective cutaway view of one embodiment of a semiconductor assembly 10 made in accordance with the principles of the present invention. FIG. 2 depicts a sectional side view of a section of the embodiment of FIG. 1. A semiconductor assembly 10 includes a semiconductor chip 12 attached in leads-over-chip ("LOC") fashion to a leadframe 14 by an adhesive element 16. In the depicted embodiment, the adhesive element 16 is an adhesive strip, such as a double sided adhesive polyimide tape such as a KAPTON™ tape, but it will be appreciated that any suitable adhesive may be used, including a liquid or gel adhesive.

Figure 1A:
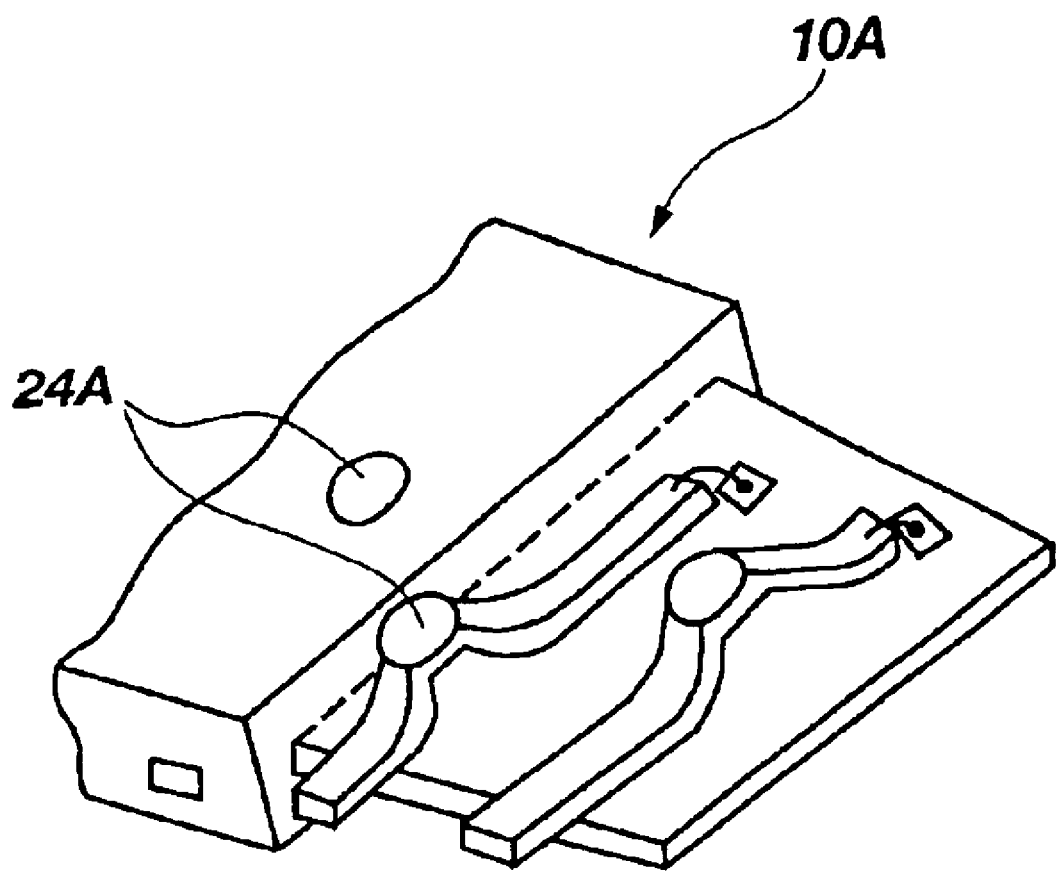
FIG. 1A is a view of an alternative embodiment of an array offset in accordance with the principles of the present invention.

Leadframe 14 includes a plurality of leads 18, such as leads 18A and 18B. Groups of leads 18 are organized into lead sets, such as first lead set 15 and a second lead set 17 on opposing sides of the longitudinal axis L of the semiconductor chip 12. Within a lead set 15, the leads 18 have substantially similar lengths, running from a side 11 of the assembly 10 toward the longitudinal axis L. Each lead 18 comprises a lead shaft 20 that generally runs within a first common plane P1. Along its length the lead shaft 20 includes an offset 22 formed as the shaft 20 extends out of the first common plane and then returns to the first common plane. The offset 22 may include an array pad 24 having a flat surface, although any suitable array pad design may be used. The array pad may vary in width or shape from the remainder of the lead. For example, FIG. 1A shows an assembly 10A including leads with circular array pads 24A, which can be useful for forming solder balls therein. Desirably, the array pads 24 of the various leads 18 lie within a second common plane, although small variations such as two or more separate common planes may be used for specific applications. It will be appreciated that the leadframe may be constructed of any suitable material known, presently or in the future, to those skilled in the art, including aluminum, copper and alloys thereof as well as ferrous alloys.

In the embodiment depicted in FIG. 1, leads 18 protrude from side 11 of molding compound 26. In fabricating assemblies 10 in accordance with the principles of the present invention, it may be advantageous to produce leadframe 14 as one of a number of leadframes 14 on a strip. A number of assemblies 10 may be fabricated on the strip, which assemblies 10 are then separated by cutting the strip. Protruding lead ends 19 of leads 18 may result from such a procedure. Alternatively, lead ends 19 may be trimmed flush at side 11. Embodiments where the lead ends 19 are enclosed within the mold compound 26 are also contemplated or within the scope of the invention, but may be somewhat more difficult to fabricate. In addition to providing electrical connection to chip 12, leads 18 may also act to conduct heat from assembly 10 during operation. The leads 18 are all of substantially similar length, and two opposite sets 15 and 17 extend across the majority of the active surface of the chip 12, to be in contact with a lead 18 and accessible to bond pads thereon. Exposed lead ends 19 increase the ability of leads 18 to conduct heat from the assembly 10, increasing the potential functional life of the assembly 10.

Leads 18 are electrically connected to the semiconductor die 12. In this depicted embodiment, the connection is accomplished by wirebonding. A gold or aluminum wire bond 25 connects an inner bond end 23 of each lead 18 to a bond pad 13 on the active surface of the chip 12 (FIG. 2). The wire bond 25 may be formed by any suitable means known to those skilled in the art. It will be appreciated that any suitable electrical connection, such as tab bonding using conductive traces carried on a flexible dielectric film, or the direct thermocompressive bonding of an inner bond end 23 of lead 18 as discussed further herein, may be used and are within the scope of the present invention.

The mechanically and electrically connected semiconductor chip 12 and leadframe 14 are encapsulated within a dielectric molding compound 26 to form a molded package. One surface 28 of the molding compound 26 lies in the second common plane P2 of the outer surfaces of array pads 24, leaving exposed at least one surface of the array pads 24. In forming the assembly 10, the connected semiconductor chip 12 and leadframe 14 are placed in a mold cavity, which is then transfer molded, injection molded or pot molded with molding compound 26 to form the complete molded package of the assembly 10. In a currently preferred embodiment, the molding process is transfer molding using a silicone particle-filled thermoplastic polymer. The array pads 24 of the leads 18 contact a surface of the mold cavity, resulting in the molding compound surface 28 residing in the same common plane P2 as the array pads 24. As a molding compound 26 enters the mold cavities as a flow front under high pressure and temperature, a thin film or "flash" of molding compound 26 may form between the array pads 24 and the adjacent mold cavity surface. Depending on the thickness of the film, it may be necessary to clean the film from the array pads 24 to allow an electrical connection to be made to those pads 24. This cleaning may require as little as a mechanical scrub of the array pads 24 or it may require that a chemical etch be performed to expose the surface of the array pads 24.

Desirably, a volume of electrically conductive material is then disposed on each of the array pads 24 to allow the assembly to be mounted and attached in a flip-chip fashion to higher-level packaging such as a circuit board. In the depicted embodiment, the conductive attachment material is shown as solder balls 30 disposed on the array pads 24. It will be appreciated that any suitable electrically conductive material known now, or in the future, to those skilled in the art may be used for discrete conductive elements to enable the assembly to be attached. Suitable conductive materials include tin/lead solder, electrically conductive epoxy, conductively-filled epoxy or any other suitable electrically conductive material that may be fashioned into a discrete conductive element by those of ordinary skill in the art. Examples of such discrete conductive elements include solder balls and conductive columns or pillars. The electrically conductive material may be disposed upon the accessible array pads 24 by disposing masses of solder paste upon the array pads followed by flowing the solder to form solder balls. Suitable techniques for alternative structures known to those skilled in the art may similarly be used. It is also contemplated that a Z-axis anisotropically conductive film may be disposed over the surface of the molded package having the exposed array pads 24 in lieu of using discrete conductive elements.

An offset 22 may be located at any position along the shaft 20 of a lead 18. Desirably, leads 18 of a lead set 15 will include several subsets, each subset having offsets 22 located at a common position. The leads 18 of each subset may be alternated, as shown in FIG. 1, to produce four rows of array pads 24. This places the array pads 24 of the lead set 15 at several different common lateral positions with respect to longitudinal axis L, creating a grid array of array pads 24.

Figure 3:
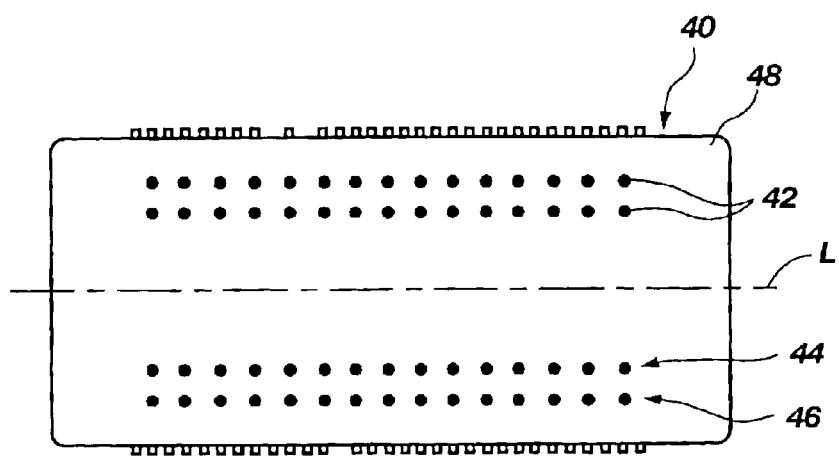
FIG. 3 is a top view of a ball grid array package made in accordance with the principles of the present invention.

FIG. 3 depicts a top view of a semiconductor assembly 40 fabricated in accordance with the principles of the present invention. Surface 48 features solder balls 42 disposed on the exposed array pads 24 (not visible), forming a ball grid array. One embodiment of a desirable grid array is depicted. By positioning offsets 22, an even number of rows of array pads 24 are aligned around longitudinal axis of center line L of the assembly 40, which may also serve as a center line of the leadframe 14 and semiconductor chip 12. Each set of rows is formed by a lead set 15 having substantially equal length, with the individual rows formed by subsets of leads 18 with array pads 24 at common positions as described above. Within a set of rows, there is an inner row 44 located proximal to the center line L, and a distal outer row 46. It will be appreciated that any desired number of rows are possible that and embodiments which lack a uniform row structure in favor of an individualized pattern are also possible. All such embodiments are within the scope of the present invention.

From the foregoing description, it can be seen that the principles of the present invention result in a semiconductor assembly including a leadframe having substantially the same length leads that create a multiposition grid array through a mold compound surface of a molded package. Such an assembly has a number of advantages, including relatively small size enhanced heat conduction, a robust structure and improved sealing of the assembly components.

Figure 4:
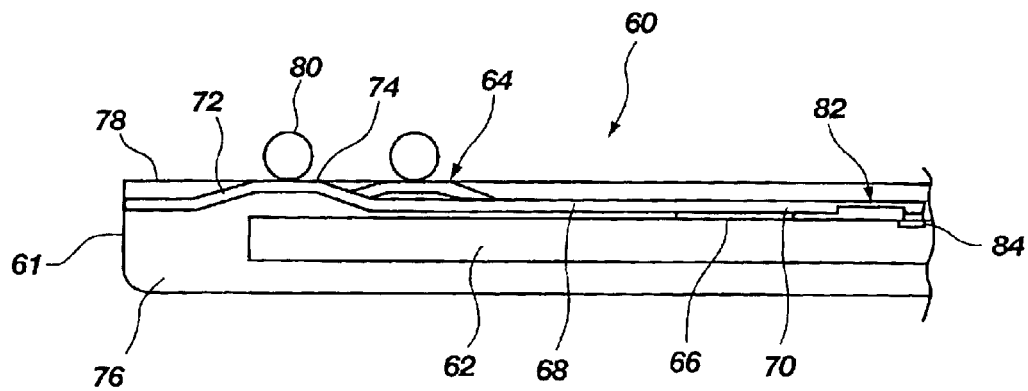
FIG. 4 is a cutaway side view of a section of another embodiment of a semiconductor assembly made in accordance with the principles of the present invention.

Turning to FIG. 4, a side view of a section of another embodiment of a semiconductor assembly made in accordance with the principles of the present invention is depicted. A semiconductor chip 62 is attached to a lead 68 of a leadframe (depicted as a section of neighboring lead 64) by an adhesive element 66, in LOC chip fashion. As described above, with respect to FIGS. 1 and 2, an offset 72 includes an array pad 74 exposed through molding compound 76 surface 78. Solder balls 80 disposed on the array pads create a ball grid array. It will be appreciated that structures and features equivalent to those discussed above, in connection with FIGS. 1 to 3, may be included in embodiments similar to that of FIG. 4 and insofar as there are common features, the prior discussion of such common features applies here as well. This discussion accordingly will focus on the additional features of FIG. 4.

Lead shaft 70 runs from a side 61 of the semiconductor assembly 60 towards inner bond end 82 directed towards the center of the assembly 60. Bonding end 82 is directing thermocompressively bonded to a bond pad 84 located on the longitudinal axis or conductive L of semiconductor chip 62.

Figure 5:
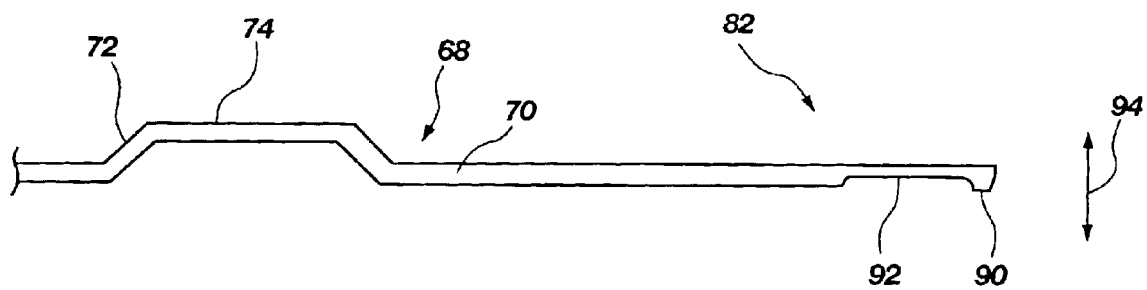
FIG. 5 is a side view of part of a lead of the embodiment of FIG. 4.

FIG. 5 depicts a lead 68 of FIG. 4, allowing inner bond end 82 to be seen in greater detail. Inner bond end 82 may feature a contact pad 90 located at the underside of the inner bond end 82 of shaft 70. Contact pad 90 is configured for bonding to a bond pad 84, when subjected to an appropriate thermocompressive effect. To enhance the ability of the contact pad 90 in forming the bond, inner bond end 82 may desirably include an area of increased flexibility adjacent and outboard from contact pad 90. Undercut 92 is located on the chip side of the shaft 70, adjacent to contact pad 90. Undercut 92 comprises a thinner section or smaller cross-section segment of the shaft 70. The shaft 70 may be formed with undercut 92 in place. Alternatively, undercut 92 may be formed by etching or grinding material from a segment of the shaft 70.

This thinner section of shaft 70 formed by the undercut 92 increases the flexibility of the shaft 70 at the bonding end 82, in directions perpendicular to the axis of the shaft 70 as depicted by arrow 94. Inner bond end 82 and specifically contact pad 90 of shaft 70 thus may be easily moved downwards towards the bond pad 84 in order to facilitate forming the thermocompressive bond therewith. It will be appreciated that the thermocompressive bond between contact pad 90 and bond pad 82 may be formed by any suitable means known now, or in the future, to those skilled in the art. It is also contemplated that a conductive or conductor-filled adhesive may be used to form an electrical and mechanical connection between contact pads 90 and bond pads 82. Likewise, a Z-axis anisotropic conductive film may be disposed therebetween.

In accordance with the description provided, the present invention includes methods of forming semiconductor assemblies that include leads-over-chip leadframes with substantially one-length leads forming a grid array through offset positioning. Similarly, the present invention includes methods of forming semiconductor assemblies which include leadframes forming an upset grid array that are thermocompressively bonded to a semiconductor chip.

It will be appreciated that the foregoing leadframes, semiconductor assemblies, and methods of forming assemblies result in structures with advantages over the prior art. Such assemblies include a molded package with inherent sealing and protection, are reinforced by a number of similar length leads creating a stronger package, include a grid array that can feature a BGA, SLICC or similar structure, may include leads allowing for improved thermocompression bonding, and allow for the semiconductor chip to be mounted in a LOC fashion. The grid array may be positioned to form an assembly that is only slightly larger than the semiconductor chip. Since a leadframe is used in forming the assembly, no expensive retooling of fabrication equipment is required.

It is apparent that details of the apparatus and methods herein described can be varied considerably without departing from the concept and scope of the invention. The claims alone define the scope of the invention as conceived and as described herein.

What is claimed is:

1. A semiconductor assembly comprising:
   a semiconductor chip comprising at least a first bond pad and at least a second bond pad on an active surface thereof;
   at least a first plurality of leads extending over the active surface of the semiconductor chip, the at least a first plurality of leads comprising at least a first lead and at least a second lead originating proximate a first side of the semiconductor chip in a first plane and having substantially similar lengths;
   the at least a first lead electrically connected to the at least a first bond pad and comprising at least a first array offset, the at least a first array offset comprising a segment of the at least a first lead between inner and outer ends thereof that extends from the first plane to form the at least a first array offset in a second plane, the at least a first lead extending from the at least a first array offset to return to the first plane, such that the at least a first lead is absent from the first plane at the at least a first array offset and the at least a first lead extends from the first plane to the second plane and returns to the first plane over the active surface of the semiconductor chip;

the at least a second lead electrically connected to the at least a second bond pad and comprising at least a second array offset, the at least a second array offset comprising a segment of the at least a second lead between inner and outer ends thereof that extends from the first plane to form the at least a second array offset in a second plane, the at least a second lead extending from the at least a second array offset to return to the first plane; and a distinctive molding compound forming a molded package over at least the active surface of the semiconductor chip and portions of the at least a first plurality of leads extending through an outer surface of the molded package disposed in the second plane such that at least a portion of the at least a first array offset and the at least a second array offset are at least partially exposed through the molded package.

2. The semiconductor assembly of claim 1, wherein the at least a first plurality of leads is attached to the active surface of the semiconductor chip with an adhesive element.

3. The semiconductor assembly of claim 1, wherein the at least a first array offset comprises a generally flat array pad.

4. The semiconductor assembly of claim 1, wherein the at least a first plurality of leads further comprises at least a first subset of leads, each lead of the first subset having at least one array offset located at a first common position with respect to a centerline of the semiconductor chip.

5. The semiconductor assembly of claim 4, wherein the at least a first plurality of leads further comprises at least a second subset of leads, each lead of the second subset having at least one array offset located at a second common position with respect to the centerline of the semiconductor chip.

6. The semiconductor assembly of claim 1, further comprising a second plurality of leads comprising at least a third lead and at least a fourth lead originating at a second side of the semiconductor chip in the first plane and having substantially similar lengths;

the at least a third lead comprising at least one array offset comprising a segment of the at least a third lead between inner and outer ends thereof that protrudes from the first plane to the second plane; and the at least a fourth lead comprising at least one array offset comprising a segment of the at least a fourth lead between inner and outer ends thereof that extends out of the first plane to the second plane.

7. The semiconductor assembly of claim 6, wherein the second plurality of leads further comprises at least one subset of leads having array offsets located at one common position with respect to a centerline of the semiconductor chip.

8. The semiconductor assembly of claim 7, wherein the second plurality of leads further comprises at least a second subset of leads having array offsets located at a second common position with respect to the centerline of the semiconductor chip.

9. The semiconductor assembly of claim 6, wherein the first side of the semiconductor chip is opposite the second side of the semiconductor chip.

10. The semiconductor assembly of claim 1, further comprising a volume of an electrically conductive material forming a discrete conductive element disposed on the at least partially exposed portions of each of the at least a first array offset and the at least a second array offset.

11. The semiconductor assembly of claim 10, wherein the electrically conductive material is selected from the group consisting of solder, conductive epoxy, and conductive-filled epoxy.

12. The semiconductor assembly of claim 10, wherein the discrete conductive elements form an array.

13. The semiconductor assembly of claim 1, wherein the outer ends of the at least a first and at least a second leads extend from the molded package.

14. The semiconductor assembly of claim 1, further comprising a z-axis anisotropic adhesive disposed over the at least partially exposed portions of the at least a first and the at least a second array offsets.

15. The semiconductor assembly of claim 1, wherein the at least a first lead and the at least a second lead are respectively electrically connected to the at least a first bond pad and the at least a second bond pad by a wirebond or a thermocompression bond.

16. A leadframe comprising:

at least a first plurality of leads, comprising at least a first lead and at least a second lead originating at a first side of the leadframe in a first plane and having substantially similar lengths;

the at least a first lead comprising at least a first array offset comprising a section of the at least a first lead that extends from the first plane to form the at least a first array offset in a second plane and then extends from the second plane returning to the first plane, such that the at least a first lead is absent from the first plane at the at least a first array offset the at least a first lead configured to extend to the second plane and return to the first plane over an active surface of a semiconductor die when the semiconductor die is attached to the leadframe; and the at least a second lead comprising at least a second array offset comprising a section of the at least a second lead that extends from the first plane to form the at least a second array offset in the second plane.

17. The leadframe of claim 16, wherein the at least a first array offset comprises a generally flat array pad.

18. The leadframe of claim 16, wherein the at least a first plurality of leads further comprises at least a first subset of leads, each lead of the at least a first subset having at least one array offset located at a first common position with respect to a centerline of a semiconductor chip.

19. The leadframe of claim 18, wherein the at least a first plurality of leads further comprises at least a second subset of leads, each lead of the at least a second subset having at least one array offset located at a second common position with respect to the centerline of the semiconductor chip.

20. The leadframe of claim 19, further comprising a second plurality of leads comprising at least a third lead and at least a fourth lead originating at a second side of the leadframe in the first plane and having substantially similar lengths;

the at least a third lead comprising at least one array offset comprising a segment of the at least a third lead between inner and outer ends thereof that protrudes from the first plane to the second plane;

the at least a fourth lead comprising at least one array offset comprising a segment of the at least a fourth lead between inner and outer ends thereof that extends out of the first plane to the second plane.

21. The leadframe of claim 20, wherein the second plurality of leads further comprises a third subset of leads having array offsets located at a third common position with respect to the centerline of the semiconductor chip.

22. The leadframe of claim 21, wherein the second plurality of leads further comprises a fourth subset of leads having array offsets located at a fourth common position with respect to the centerline of the semiconductor clip.

23. The leadframe of claim 20, wherein the array offsets of the at least a first plurality of leads and the second plurality of leads form an array.

24. The leadframe of claim 23, wherein the array comprises an even number of rows of array offsets arranged with respect to a centerline of the leadframe.

25. The leadframe of claim 24, wherein the array comprises four rows comprising two interior rows disposed with respect to the centerline and two exterior rows disposed distally with respect to the interior rows.

26. The leadframe of claim 16, wherein the first side of the leadframe is opposite the second side of the leadframe.

27. The leadframe of claim 16, where the at least a first lead is configured for electrical connection to an electrical contact pad of a semiconductor chip by a wirebond connection or a thermocompression bond.

28. A semiconductor assembly comprising:
 a semiconductor chip comprising a first surface with at least a first electrical contact pad;
 a leadframe comprising at least a first lead comprising a first lead shaft and a bonding end, the bonding end comprising a bonding pad located at an end of the lead shaft, the bonding pad attached to the at least a first electrical contact pad by a thermocompression bond, the first lead shaft extending out from a first plane to form at least a first array offset in a second plane over an active surface of the semiconductor chip and then extending from the second plane to return to the first plane over the active surface; and
 a molding compound forming a molded package encapsulating the semiconductor chip and the leadframe.

29. The semiconductor assembly of claim 28, wherein the molded package comprises a surface disposed in the second plane such that at least a portion of the at least a first array offset is exposed, allowing the semiconductor chip to be electrically accessed.

30. The semiconductor assembly of claim 29, further comprising an electrically conductive attachment compound disposed on the at least a portion of the at least a first array offset that is exposed.

31. The semiconductor assembly of claim 30, wherein the electrically conductive attachment compound comprises solder.

32. The semiconductor assembly of claim 28, wherein the leadframe further comprises a plurality of leads, each lead of the plurality including an array offset forming a plurality of array offsets.

33. The semiconductor assembly of claim 32, wherein the plurality of array offsets forms a grid array pattern.

34. The semiconductor assembly of claim 33, wherein the grid array pattern forms a grid array comprising an even number of rows of array pads arranged around a centerline defining an axis of the semiconductor assembly.

35. The semiconductor assembly of claim 34, wherein the grid array pattern comprises four rows comprising two interior rows disposed proximal around the centerline and two exterior rows disposed distally with respect to the interior rows.

36. The semiconductor assembly of claim 32, wherein the plurality of leads further comprises two opposite sets of leads, a first set of leads and a second set of leads, each disposed around a centerline of the semiconductor assembly, a bonding end of each lead located proximal to the centerline facing the opposite set of leads.

37. The semiconductor assembly of claim 36, wherein leads of the first set of leads are all of substantially similar length.

38. The semiconductor assembly of claim 37, wherein leads of the second set of leads are all of substantially similar length.

39. The semiconductor assembly of claim 28, wherein the at least a first array offset comprises a generally flat array pad.

40. The semiconductor assembly of claim 28, wherein the bonding end further comprises an undercut formed in the lead shaft distal to the bonding pad.

41. A leadframe comprising:
 at least a first lead comprising a lead shaft and a bonding end, the bonding end comprising a bonding pad located at an end of the lead shaft, the bonding pad configured for attachment to an electrical contact pad of a semiconductor chip by a thermocompression bond, the lead shaft extending out from a first plane to form at least a first array offset y plane and then extending from the second plane to return to the first plane such that the lead shaft is configured to extend to the second plane and return to the first plane over an active surface of a semiconductor die when the semiconductor die is attached to the leadframe.

42. The leadframe of claim 41, wherein the bonding end further comprises an undercut formed in the lead shaft distal to the bonding pad.

43. The leadframe of claim 41, wherein the at least a first array offset comprises a generally flat array pad.

44. The leadframe of claim 41, wherein the leadframe further comprises a plurality of leads, each lead of the plurality including an array offset forming a plurality of array offsets.

45. The leadframe of claim 44, wherein the plurality of array offsets forms a grid array pattern.

46. The leadframe of claim 45, wherein the grid array pattern forms a grid array comprising an even number of rows of array pads arranged around a centerline defining an axis of the leadframe.

47. The leadframe of claim 46, wherein the grid array pattern comprises four rows comprising two interior rows disposed proximal around the centerline and two exterior rows disposed distally with respect to the interior rows.

48. The leadframe of claim 44, wherein the plurality of leads further comprises two opposite sets of leads, a first set of leads and a second set of leads, each disposed around the centerline of the leadframe, a bonding end of each lead of the plurality located proximal to a centerline facing the opposite set of leads.

49. The leadframe of claim 48, wherein leads of the first set of leads are all of substantially similar length.

50. The leadframe of claim 49, wherein leads of the second set of leads are all of substantially similar length.

51. A semiconductor assembly comprising:
 a semiconductor chip;
 a leadframe including a plurality of leads of similar length in electrical communication with the semiconductor chip, each lead of the plurality including an array offset along a shaft thereof, the array offsets formed as each lead extends from a first plane to form an array offset residing in a coextensive second common plane then extending from the array offset to return to the first plane, such that each lead is absent from the first plane from a point of extension to a point of return, at least a first lead of the plurality of leads configured to extend to the second plane and return to the first plane over an active surface of the semiconductor chip; and
 a mold compound at least partially encapsulating the semiconductor chip and leadframe such that the array offsets are exposed.

52. The semiconductor assembly of claim 51, wherein the array offsets are arranged to form a grid array.

* * * * *

UNITED STATES PATENT AND TRADEMARK OFFICE
CERTIFICATE OF CORRECTION

| | | |
|---|---|---|
| PATENT NO. | : 6,836,008 B2 | Page 1 of 2 |
| APPLICATION NO. | : 10/136186 | |
| DATED | : December 28, 2004 | |
| INVENTOR(S) | : Chan Min Yu et al. | |

It is certified that error appears in the above-identified patent and that said Letters Patent is hereby corrected as shown below:

In the drawings:

In FIG. 1,    change the lowermost right-hand occurrence of reference numeral "24" to --16--

In FIG. 2,    insert reference numeral --23-- with appropriate lead line

Delete Sheet 1 of 4 and please replace FIG. 1 with the following amended figure:

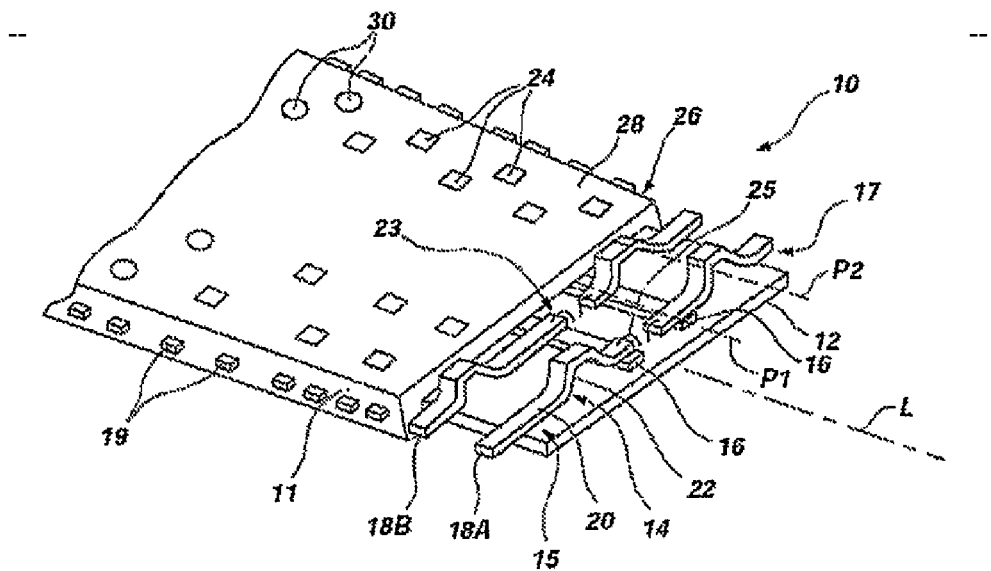

FIG. 1

UNITED STATES PATENT AND TRADEMARK OFFICE
CERTIFICATE OF CORRECTION

| | | |
|---|---|---|
| PATENT NO. | : 6,836,008 B2 | Page 2 of 2 |
| APPLICATION NO. | : 10/136186 | |
| DATED | : December 28, 2004 | |
| INVENTOR(S) | : Chan Min Yu et al. | |

It is certified that error appears in the above-identified patent and that said Letters Patent is hereby corrected as shown below:

Delete current figure 2 and please replace FIG. 2 with the following amended figure:

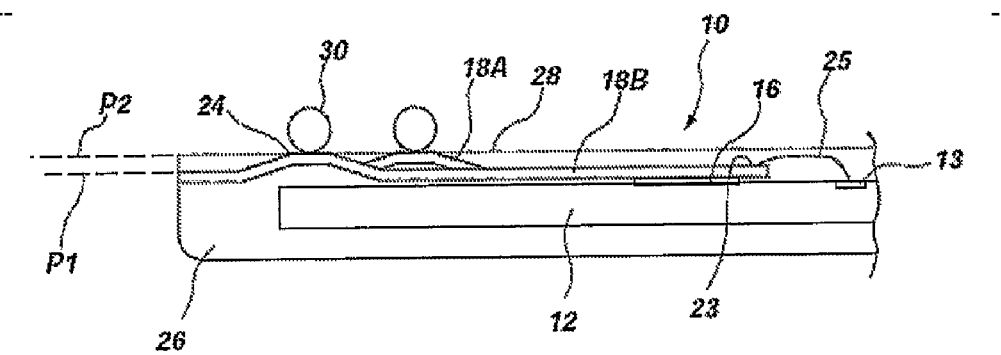

FIG. 2

In the specification:

| | | |
|---|---|---|
| COLUMN 5, | LINE 50, | change "76 surface 78." to --76 of surface 78.-- |
| COLUMN 6, | LINE 30, | change "upset grid array" to --offset grid array-- |

In the claims:

| | | | |
|---|---|---|---|
| CLAIM 41, | COLUMN 10, | LINE 11, | change "offset y plane" to --offset in a second plane-- |

Signed and Sealed this

Thirteenth Day of November, 2007

JON W. DUDAS
*Director of the United States Patent and Trademark Office*